United States Patent [19]

Rybicki et al.

[11] Patent Number: 5,055,847
[45] Date of Patent: Oct. 8, 1991

[54] DIFFERENTIAL SENSING CURRENT-STEERING ANALOG-TO-DIGITAL CONVERTER

[75] Inventors: Mathew A. Rybicki, Austin; Roger A. Whatley, Georgetown, both of Tex.; Katsufumi Nakamura, Pittsburgh, Pa.

[73] Assignee: Motorola, Inc., Schaumburg, Ill.

[21] Appl. No.: 656,334

[22] Filed: Feb. 19, 1991

[51] Int. Cl.$^5$ ............................................. H03M 1/38
[52] U.S. Cl. .................................................... 341/162
[58] Field of Search ............... 341/165, 155, 162, 164, 341/161, 153, 154, 144, 126; 307/362, 360

[56] References Cited

U.S. PATENT DOCUMENTS

| | | |
|---|---|---|
| 4,282,515 | 8/1981 | Patterson, III ................. 341/165 X |
| 4,358,752 | 11/1982 | Tamada et al. . |
| 4,590,456 | 5/1986 | Burton et al. . |
| 4,764,753 | 8/1988 | Yukawa . |
| 4,961,045 | 10/1990 | Gray et al. . |
| 5,010,337 | 4/1991 | Hisano et al. ....................... 341/154 |

OTHER PUBLICATIONS

IEEE Trans. on Circuits and Systems, "A Sigma-Delta Modulator as an A/D Converter", Van de Plassche, vol. cas-25, No. 7, Jul. 1978, pp. 510-514.

IEEE Journal Of Solid-State Circuits, "A Self-Calibration Technique for Monolithic High-Resolution D/A Converters", Groenveld et al., vol. 24, No. 6, Dec. 1989, pp. 1517-1522.

Primary Examiner—J. R. Scott
Assistant Examiner—Sharon D. Logan
Attorney, Agent, or Firm—Robert L. King

[57] ABSTRACT

An analog-to-digital converter utilizes both a successive approximation register and a current steering circuit within a digital-to-analog converter to achieve an improved conversion speed, and improved resolution for a predetermined amount of power. The current steering circuit, which is controlled by the successive approximation register, connects constant current sources to current source loads to produce a differential signal output. By steering current from the differential current source loads to the constant current sources, a signal difference resolves at the output of the digital-to-analog converter faster and with greater resolution.

13 Claims, 1 Drawing Sheet

DIFFERENTIAL SENSING CURRENT-STEERING ANALOG-TO-DIGITAL CONVERTER

FIELD OF THE INVENTION

This invention relates generally to analog-to-digital converter circuits, and more particularly, to current steering analog-to-digital converter circuits.

BACKGROUND OF THE INVENTION

There are various methods of implementing an analog-to-digital (A/D) converter. The various methods include, but are not limited to, flash conversion, dual slope conversion, sigma-delta conversion and successive approximation conversion. Each of the various analog-to-digital conversion methods may be implemented using a variety of circuitry. The circuitry may include, but is not limited to, a resistor ladder, a plurality of appropriately sized capacitors, and a plurality of constant current sources. The various combinations of digital conversion methods and circuitry for implementing analog-to-digital converters each have advantages and disadvantages. The advantages and disadvantages are typically expressed in terms of speed of conversion, accuracy of conversion, power consumption during operation, and cost of implementation.

Examples of analog-to-digital converters that utilize a successive approximation method of conversion are discussed within U.S. Pat. No. 4,358,752 entitled "Analog-To-Digital Converter", by Tamada et al.. FIG. 1 of U.S. Pat. No. 4,358,752, is a block diagram of an analog-to-digital converter utilizing a comparator, a successive approximation register (SAR), and a digital-to-analog converter. Analog-to-digital converters which utilize current sources share a common aspect in that current available from current sources within the digital-to-analog portion of the analog-to-digital converter is not utilized as efficiently as possible. That is, during the conversion operation the current sources are alternately connected, via a switch, to either an input terminal of a comparator or a terminal of a power supply. During the time period in which the current source is connected to the terminal of the power supply, power is inefficiently consumed by shunting current from the power supply via the switch through the current source. Other examples of analog-to-digital converters that have this feature are illustrated in U.S. Pat. No. 4,764,753 entitled "Analog To Digital Converter", by Yukawa, and U.S. Pat. No. 4,590,456 entitled "Low Leakage CMOS D/A Converter", by Burton et al.. Other disadvantages with known A/D converters utilizing current steering include a lack of sufficient noise immunity. Typically, in order to achieve better noise immunity, an increase in power consumption is required.

SUMMARY OF THE INVENTION

The previously mentioned needs are fulfilled with the present invention. In one form, a differential sensing current-steering analog-to-digital circuit and method of operation is provided. A means for receiving an analog input signal provides proportional first and second differential output currents at a first and a second output terminal, respectively. A digital-to-analog converter means has first and second terminals respectively coupled to the first and second output terminals of the means for receiving and has a predetermined plurality of current sources. The digital-to-analog converter means selectively conducts current either to or from each of the first and second output terminals by using the plurality of current sources. A comparator means has first and second inputs respectively coupled to the first and second terminals of the digital-to-analog converter means, and has an output which indicates whether a difference in signal at the first and second terminals is within a predetermined range. A successive approximation register means has an input coupled to the output of the comparator means. The successive approximation register means selectively provides a control signal as a converted digital signal of the analog input signal. The control signal controls conduction of predetermined current sources of the digital-to-analog converter means. These and other features, and advantages, will be more clearly understood from the following detailed description taken in conjunction with the accompanying drawing.

DESCRIPTION OF A PREFERRED EMBODIMENT

Figure 1:
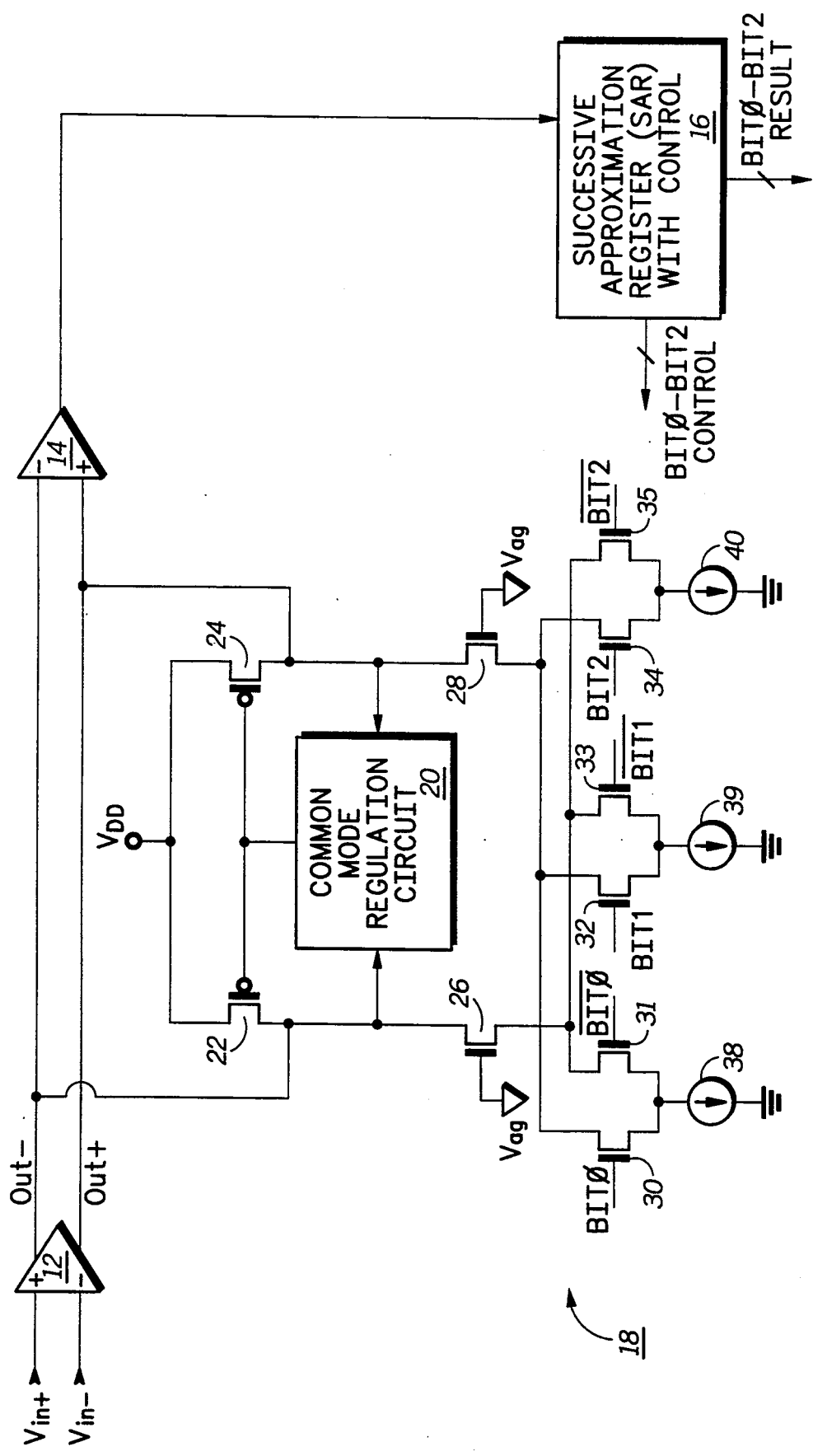
FIG. 1 illustrates, in partial block diagram form, an integer-bit analog-to-digital converter in accordance with the present invention.

FIG. 1 illustrates an analog-to-digital converter circuit 10 utilizing a successive approximation register (SAR) conversion method. The analog-to-digital circuit 10 generally has a transconductance amplifier 12, a signal comparator 14, an SAR with control 16, and a current steering digital-to-analog converter portion 18. The digital-to-analog converter portion 18 has a common mode regulation circuit 20, a first regulated P-channel transistor 22, a second regulated P-channel transistor 24, N-channel transistors 26 and 28, current steering transistor switches 30–35, and constant current sources 38–40. In the preferred embodiment, signal comparator 14 is a voltage comparator, and the common mode regulation circuit 20 is a common mode voltage sensing voltage regulating circuit.

The transconductance amplifier 12 has a first input, labeled $V_{in+}$, for receiving a first analog input signal, a second input, labeled $V_{in-}$, for receiving a second analog input signal, a first output, labeled $O_{ut-}$, which is connected to both a first input of the signal comparator 14 and a first output of the digital-to-analog converter portion 18, and a second output, labeled $O_{ut+}$, which is connected to both a second input of signal comparator 14 and a second output of the digital-to-analog comparator portion 18. The signal comparator 14 has a first output connected to an input of the SAR with control 16. The SAR with control 16 has a control output connected to an input of the digital-to-analog comparator portion 18 labeled "BIT0–BIT2 Control," and a result output for providing the result of the analog-to-digital conversion labeled "BIT0–BIT2 Result." The regulated P-channel transistor 22 has a control electrode or gate connected to both a gate of the regulated P-channel transistor 24 and an output of the common mode regulation circuit 20. The common mode regulation circuit 20 has a first input connected to the first output of the digital-to-analog converter portion 18, and a second input connected to the second output of the digital-to-analog converter portion 18. The regulated P-channel transistor 22 has a source connected to a common positive power supply $V_{DD}$ for receiving power, and a drain connected to both the first output of the digital-toanalog converter portion 18 and to a drain of the N-channel transistor 26. The regulated P-channel transistor 24 has a source connected to the common positive power supply $V_{DD}$ for receiving power, and a drain connected to both the second output of the digital-to-analog converter portion 18, and to a drain of the N-channel transistor 28. The N-channel transistor 26 has a gate connected to a voltage $V_{ag}$, and a source connected to a drain of each of the current steering transistor switches 31, 33, and 35. The voltage $V_{ag}$ is a predetermined constant voltage and is typically AC-ground. The N-channel transistor 28 has a gate connected to the voltage $V_{ag}$, and a source connected to a drain of each of the current steering transistor switches 30, 32, and 34. The current steering transistor switch 30 has a gate connected to an output of the SAR with control 16 labeled BIT0, and has a source connected to both an input of the constant current source 38 and a source of current steering transistor switch 31. The current steering transistor switch 31 has a gate connected to an output of the SAR with control 16 labeled $\overline{BIT0}$ which is the complement of BIT0. The current steering transistor switch 32 has a gate which is connected to an output of the SAR with control 16 labeled $\overline{BIT1}$, and a source which is connected to both an input of the constant current source 39 and a source of the current steering transistor switch 33. The current steering transistor switch 33 has a gate which is connected to an output of the SAR with control 16 labeled BIT1. The current steering transistor switch 34 has a gate which is connected to an output of the SAR with control 16 labeled $\overline{BIT2}$, and has a source which is connected to both an input of the constant current source 40 and to a source of the current steering transistor switch 35. The current steering transistor switch 35 has a gate which is connected to an output of the SAR with control 16 labeled BIT2. Each of the constant current sources 38, 39, and 40 has an output which is connected to a common negative power supply, ground.

In operation, the common mode regulation circuit 20 provides a regulated control voltage to the control electrodes of the P-channel transistors 22 and 24 in response to a common mode signal between $O_{ut-}$ and $O_{ut+}$. As mentioned previously, the common mode regulation circuit 20 is a common mode voltage sensing voltage regulating circuit, therefore the common mode signal between $O_{ut-}$ and $O_{ut+}$ is a common mode voltage. In response to the regulated control voltage, the P-channel transistors 22 and 24 provide predetermined and equal amounts of current and thus a zero voltage difference at the differential output of the digital-to-analog converter portion 18 during a quiescent state of operation. A voltage difference between input voltages $V_{in+}$ and $V_{in-}$ connected to the transconductance amplifier 12 provides a proportional differential current at $O_{ut-}$ and $O_{ut+}$. The differential current provided by transconductance amplifier 12 at $O_{ut-}$ and $O_{ut+}$ is respectively summed with the current provided by the regulated P-channel transistors 22 and 24 at the differential output of the digital-to-analog converter portion 18 to collectively produce a first differential current summing solution.

The constant current sources 38–40 each source a predetermined amount of constant current. For the purpose of illustration, assume that the amount of current from current source 39 is twice the current from current source 38, and the amount of current from current source 40 is twice the current from current source 39. It should be well understood that any ratio between current sources 38–40 may be implemented. In response to the BIT0–BIT2 control signals from the SAR with control 16, the current steering transistor switches 30–35 selectively connect the constant current sources 38–40 to the source of either N-channel transistor 26 or N-channel transistor 28. When the constant current sources 38–40 are selectively connected to the source of either N-channel transistor 26 or N-channel transistor 28, current from the selectively switched current sources are summed with the current from the first current summing solution, mentioned above, to collectively produce a second differential current summing solution at the differential output of the digital-to-analog converter portion 18.

The N-channel transistors 26 and 28 each exhibit a predetermined resistance between the respective drain and source electrodes having a value which is controlled in part by the voltage $V_{ag}$ present at each gate thereof. The P-channel transistors 22 and 24 each exhibit a predetermined resistance between the respective source and drain electrodes having a value determined in part by the regulated control voltage received from the common mode regulation circuit 20. The output resistance of the digital-to-analog converter portion 18 present at $O_{ut-}$ is approximately the parallel combination of resistances of the N-channel transistor 26 and the regulated P-channel transistor 22. The output resistance of the digital-to-analog converter portion 18 present at $O_{ut+}$ is approximately the parallel combination of resistances of the N-channel transistor 28 and the regulated P-channel transistor 24. In response to both the output resistances at the differential outputs of the digital-to-analog converter portion 18 and the second differential current solution at the differential output of the digital-to-analog converter portion 18, a predetermined differential voltage is created at the differential output of the digital-to-analog converter portion 18. For example, assume that constant current source 38 sources a current 'I', current source 39 sources a current '2I', and current source 40 sources a current '4I'. Also, the regulated P-channel transistors 22 and 24 each source a current of '3.5I', and assume that a voltage difference at the inputs to the transconductance amplifier 12, ($V_{in+} - V_{in-}$), produces a current of '(−I)' at $O_{ut-}$ and '(+I)' at $O_{ut+}$. Further assume that the output resistance of the digital-to-analog converter portion 18 at the drain terminals of N-channel transistors 26 and 28 are each kΩ, where I and k are some predetermined constant. Assume also that the control output of the SAR with control 16 is initially:

| BIT0 | BIT1 | BIT2 |
|---|---|---|
| 0 | 0 | 1 |

This particular control bit pattern activates the current steering transistor switches 31, 33 and 34. With current steering transistor switches 31, 33 and 34 activated, constant current sources 38 and 39 are connected to the source of N-channel transistor 26, and constant current source 40 is connected to the source of N-channel transistor 28. The equation for the sum of currents at the drain of N-transistor 26 is:

$$(3.5)I + (-I) - (3)I = -(0.5)I.$$

The sum of current at the drain of N-channel transistor 28 is:

$$(3.5)I + (+I) - (4)I = +(0.5)I.$$

The voltage change with respect to the common-mode voltage present at the first output of digital-to-analog converter portion 18, $O_{ut-}$, is then $-(0.5)I*k\Omega$, and the voltage change with respect to the common-mode voltage present at the second output of the digital-to-analog converter portion 18, $O_{ut+}$, is $+(0.5)I*k\Omega$. The signal comparator 14 detects the voltage difference at the differential outputs of the digital-to-analog converter portion 18 and provides a control signal to the SAR with control 16. The SAR with control 16 utilizes the resulting control signal from the signal comparator 14 to resolve a bit of precision of the analog-to-digital conversion.

For example, utilizing the analog-to-digital converter 10, the control within the SAR with control 16 of converter 10 provides a first bit pattern control output of:

| BIT0 | BIT1 | BIT2 |
|------|------|------|
| 0    | 0    | 1    |

As mentioned above, the above bit pattern activates current steering transistor switches 31, 33 and 34 and produces a voltage difference at the differential output of the digital-to-analog converter of:

$$+(0.5)I*k\Omega - [-(0.5)I*k\Omega] = 1(I)*k\Omega.$$

In response to this differential voltage, the output of the signal comparator 14 produces an active digital signal level. The SAR with control 16 resolves the most significant bit of the analog-to-digital conversion to a logic one in response to the active digital signal level from the signal comparator 14. The SAR with control 16 then provides a second bit pattern control output of:

| BIT0 | BIT1 | BIT2 |
|------|------|------|
| 0    | 1    | 1    |

The above control bit pattern activates the current steering transistor switches 31, 32, and 34, and produces a differential voltage at the output of the digital-to-analog converter portion 18 of:

$$-(1.5)I*k\Omega - (1.5)I*k\Omega = -3(I)*k\Omega.$$

In response to this differential voltage, the output of the signal comparator 14 produces an inactive digital signal level. The SAR with control 16 therefore resolves BIT1 of the output result to a zero. The SAR with control 16 then provides a second bit pattern control output of:

| BIT0 | BIT1 | BIT2 |
|------|------|------|
| 1    | 0    | 1    |

The above control bit pattern activates the current steering transistor switches 30, 33, and 34, and produces a differential voltage at the output of the digital-to-analog converter portion 18 of:

$$-(0.5I)*k\Omega - (0.5)I*k\Omega = -1(I)*k\Omega.$$

In response to this differential voltage, the output of the signal comparator 14 produces an inactive digital signal level. The SAR with control 16 therefore resolves BIT0 of the output result to a zero. The final result of the successive approximation for the example above, which is provided at the BIT0–BIT2 Result output of the SAR with control 16, is then:

| BIT0 | BIT1 | BIT2 |
|------|------|------|
| 0    | 0    | 1    | where BIT2 represents the most significant bit position and BIT0 represents a least significant bit position.

Analog-to-digital converter 10 efficiently utilizes the current from the current sources 38–40 during the entire conversion operation by taking advantage of the differential current to produce a differential voltage. That is, when the current steering transistors 30–35 are selectively activated, constant current sources 38–40 conduct current from either P-channel transistor 22 or P-channel transistor 24. In contrast, existing current-steering analog-to-digital converters effectively utilize a transitioning output voltage from only a single output of a differential digital-to-analog converter. That is, when a current steering transistor connects a constant current source to the single output of the digital-to-analog converter, a change in voltage occurs at the output of the digital-to-analog converter. When the current steering transistor connects a reference voltage source to the single output of the digital-to-analog converter, there is no change in voltage at the output of the digital-to-analog converter. In contrast, since the current steering transistors of the analog-to-digital converter circuit 10 always couple a current source to one of two outputs of the digital-to-analog converter circuit, a voltage differential is guaranteed at the output of the digital-to-analog converter portion 18. The voltage difference at the output of the digital-to-analog converter portion 18 is therefore twice as much as the output voltage difference of existing digital-to-analog converters. Use of a differential digital-to-analog structure provides improved noise immunity because noise variations are seen as a common-mode error source and not a differential signal error. An increase in differential voltage at the output of the digital-to-analog converter portion 18 results from using a differential output rather than a single output. That is, when the voltage at one output increases by a predetermined amount, the voltage at the other output decreases resulting in a greater voltage difference than with a single output. Because of this increase in voltage difference resulting from the use of differential outputs, analog-to-digital converter circuit 10 can resolve approximately twice as fast as a single output digital-to-analog converter implanted with the same resolution and power disipation. The present invention may achieve the same resolution as a single output digital-to-analog converter by using approximately one-half of the power. Therefore, the present invention is more power efficient for a predetermined noise immunity than existing analog-to-digital converters. It should also be understood that the resolution in an analog-to-digital converter in accordance with the present invention may be approximately doubled as compared with a single output digital-to-converter with the same speed and power characteristics.

It should be well understood that an analog-to-digital converter in accordance with the present invention utilizes current steering to direct available current to a constant current source. A differential output voltage of the digital-to-analog converter portion 18 is thereby provided which can be readily designed to have one of an increase in speed, an increase in resolution, a reduction in power, or a combonation thereof. The differential output voltage of the digital-to-analog converter portion 18 is obtained by connecting and using the current steering transistors to constant current sources for all combinations of input control signals from the SAR.

It should be apparent that although a three-bit analog-to-digital converter is discussed and illustrated, any integer number of bits may be implemented. Current sources having any predetermined ratio may be implemented. It should also be apparent that transconductance amplifier 12 is not required to practice the present invention. In one form, a differential input signal may be connected directly to the $O_{ut-}$ and $O_{ut+}$ terminals. Although specific N-channel and P-channel MOS transistors are discussed, it should be well understood that the present invention may be implemented with other types of transistors and transistors having other conductivities.

It should also be apparent to those skilled in the art that although the signal comparator 14 is implemented as a voltage comparator, other comparator types such as a current comparator may be substituted, and although the common mode regulation circuit 20 is implemented as a voltage sensing voltage regulating circuit, a current sensing voltage regulating circuit may be utilized.

While there have been described herein the principles of the invention, it is to be clearly understood to those skilled in the art that this description is made only by way of example and not as a limitation to the scope of the invention. Accordingly, it is intended, by the appended claims, to cover all modifications of the invention which fall within the true spirit and scope of the invention.

We claim:

1. A differential sensing current-steering analog-to-digital converter, comprising:
   means for receiving first and second differential currents representing an analog input signal at first and second output terminals, respectively;
   a digital-to-analog converter means having first and second terminals respectively coupled to the first and second output terminals and a predetermined plurality of current sources, the digital-to-analog converter means concurrently conducting current either to or from each of the first and second output terminals by using the plurality of current sources;
   a comparator means having first and second inputs respectively coupled to the first and second terminals of the digital-to-analog converter means, and having an output which indicates whether a difference in signal at the first and second terminals is within a predetermined range; and
   a successive approximation register means having an input coupled to the output of the comparator means, said successive approximation register means selentively providing a control signal as a converted digital signal of the analog input signal, the control signal controlling conduction of predetermined current sources of the digital-to-analog converter means.

2. The analog-to-digital converter of claim 1 wherein the digital-to-analog converter means further comprise:
   common-mode regulation means coupled to the first and second output terminals for establishing and maintaining a predetermined common-mode voltage at the first and second output terminals.

3. The analog-to-digital converter of claim 1 wherein the digital-to-analog converter means further comprise:
   common-mode regulation means coupled to the first and second output terminals for establishing and maintaining a predetermined common-mode current at the first and second output terminals.

4. The analog-to-digital converter of claim 1 wherein the analog input signal received by the means for receiving further comprises differential input voltages and the successive approximation register means selectively provides the control signal as a digital equivalent of a differential between the differential input voltages.

5. The analog-to-digital converter of claim 1 wherein the digital-to-analog converter means further comprise:
   a first transistor of a first conductivity type having a first current electrode coupled to a first power supply voltage terminal, a control electrode, and a second current electrode coupled to the first output terminal;
   a second transistor of the first conductivity type having a first current electrode coupled to the first power supply voltage, a control electrode coupled to the control electrode of the first transistor, and a second current electrode coupled to the second output terminal;
   common mode regulation means having a first input coupled to the first output terminal, a second input coupled to the second output terminal, and an output coupled to the control electrodes of the first and second transistors;
   a third transistor of a second conductivity type having a first current electrode coupled to the second current electrode of the first transistor, a control electrode coupled to a second power supply voltage terminal, and a second current electrode;
   a fourth transistor of the second conductivity type having a first current electrode coupled to the second current electrode of the second transistor, a control electrode coupled to the second power supply voltage terminal, and a second current electrode;
   a plurality of current sources, each current source having a first terminal, and a second terminal coupled to a third power supply voltage terminal; and
   a plurality of pairs of transistors, each pair of transistors having first current electrodes coupled to the first terminal of a predetermined one of the current sources, a first transistor of each pair having a control electrode coupled to the control signal and a second current electrode coupled to the second current electrode of the third transistor, a second transistor of each pair having a control electrode coupled to a complement of the control signal and a second current electrode coupled to the second current electrode of the fourth transistor.

6. The analog-to-digital converter of claim 5 wherein the control signal is a digital signal having N bits, where N is an integer, and the plurality of pairs of transistors comprises N transistor pairs.

7. The analog-to-digital converter of claim 6 wherein each of the N bits is used to control a predetermined one of the pairs of transistors.

8. A method for converting an analog input signal to an equivalent digital value, comprising the steps of:
receiving the analog input signal and providing proportional differential output currents to first and second circuit nodes;
simultaneously selectively conducting current either to or from the first and second circuit nodes;
providing a control signal having a value which represents a difference in signal at the first and second circuit nodes; and
using the control signal to control said selective conduction of current through both the first and second circuit nodes when performing a successive approximation, the control signal selectively representing the equivalent digital value.

9. The method of claim 8 further comprising the step of:
establishing and maintaining the signal as a predetermined common-mode signal at the first and second circuit nodes.

10. The method of claim 8 further comprising the step of:
establishing and maintaining the signal as a predetermined common-mode voltage at the first and second circuit nodes.

11. The method of claim 8 further comprising the step of:
establishing and maintaining the signal as a predetermined common-mode current at the first and second circuit nodes.

12. A differential sensing current-steering analog-to-digital converter, comprising:

an amplifier for receiving differential analog input voltages and providing first and second differential output currents at first and second output terminals, respectively;
a comparator having first and second inputs respectively coupled to the first and second output terminals of the amplifier, and having an output which indicates whether a difference in signal at the first and second terminals is within a predetermined range;
a successive approximation register means having an input coupled to the output of the comparator, said successive approximation register means providing a series of control signals, a final one of the control signals representing a converted digital signal of the differential analog input voltages; and
a digital-to-analog converter having first and second terminals respectively coupled to the first and second output terminals of the amplifier, the digital-to-analog converter concurrently conducting first and second currents in respective first and second current conduction paths between the first and second output terminals of the amplifier and a reference voltage terminal and in response to the series of control signals, the first and second currents developing a differential signal at the first and second inputs of the comparator.

13. The differential sensing current-steering analog-to-digital converter of claim 12 wherein each of the series of control signals is a digital signal having N bits, where N is an integer.

* * * * *